(12) United States Patent
Mayhead et al.

(10) Patent No.: US 6,216,186 B1
(45) Date of Patent: Apr. 10, 2001

(54) MODULAR COMPUTER SYSTEM INCLUDING COMPATIBILITY EVALUATION LOGIC

(75) Inventors: Martin Mayhead, Fleet (GB); Emrys J. Williams, Sunnyvale, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/097,469

(22) Filed: Jun. 15, 1998

(51) Int. Cl.[7] .................................................. G06F 13/00
(52) U.S. Cl. ................................... 710/102; 713/100
(58) Field of Search ......................... 710/100–104, 710/8, 62, 63, 72, 15; 714/1; 709/220; 717/11; 712/227; 713/100; 702/108

(56) References Cited

U.S. PATENT DOCUMENTS

| | | |
|---|---|---|
| 5,018,146 | 5/1991 | Sexton . |
| 5,715,422 | * 2/1998 | Perkins . |
| 5,790,890 | * 8/1998 | Mirov et al. . |
| 5,892,683 | * 4/1999 | Sung . |

FOREIGN PATENT DOCUMENTS

| | | |
|---|---|---|
| 0 204 507 | 12/1986 | (EP) . |
| 0 793 169 | 9/1997 | (EP) . |
| 2 202 062 | 9/1988 | (GB) . |

OTHER PUBLICATIONS

International Search Report, Application No. PCT/US99/13085, mailed Nov. 8, 1999.

* cited by examiner

*Primary Examiner*—Gopal C. Ray
(74) *Attorney, Agent, or Firm*—Conley, Rose & Tayon, PC; B. Noël Kivlin

(57) ABSTRACT

A module for a modular system includes requirement indicators defining features of a component required for the module to operate, capability indicators defining features provided by the module and ability indicators defining features of the component acceptable to the module. The combination of the requirements, compatibility and ability indicators provides a very flexible structure for indicating and testing requirements and capabilities in that it permits the designation of requirements, capabilities and the capability to accept inverted capabilities. A variable number of the requirement, capability and ability indicators can be provided to accommodate future requirements. Verification logic is operable to determine compatibility when defined relationships between the requirement, capability and ability indicators for the module and an interconnected component are met. One of the module and the component can be a system component such as a mother board.

39 Claims, 3 Drawing Sheets

MODULAR COMPUTER SYSTEM INCLUDING COMPATIBILITY EVALUATION LOGIC

BACKGROUND OF THE INVENTION

This invention relates to computer systems comprising pluggable modules and to such pluggable modules.

Computer systems typically include a number of pluggable modules, that is modules or components which may be plugged into a system to provide specific functionality. The use of pluggable modules is convenient in order to provide for a versatile configuration and for long term repair requirements.

Particularly, but not exclusively, in reliable systems, it is important to be able to establish that the modules plugged in actually are compatible. By this is meant that a module which may be inserted in a modular system needs to tested before it is fully integrated into the system and before the system relies on that module. The testing is typically done after the module is physically inserted into the system, but before the module is fully integrated functionally. The module could be a hardware or a software module.

Over the years, the capabilities of a module may change as different versions are released. For example, initially a disk module may be made of two 1 Gbyte drives. Later, it may be made with one 2 Gbyte drive. This change may be of no consequence in some systems, but may be important in others.

When mixing modules of different manufacture dates in the field, information on some capabilities may be needed, even if those capabilities were not even thought of when a module was built.

An aim of the present invention is to address the problem of providing information on and resolving such compatibility issues between interacting modules.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

In accordance with one aspect of the invention, there is provided a module for a modular system. The module comprises requirement indicators defining features of a component required for the module to operate. It also comprises capability indicators defining features provided by the module. It further comprises ability indicators defining features of the component acceptable to the module.

An ability indicator effectively defines the ability to accept inverted capabilities. It should be noted that the capabilities mentioned above could be referred to as first capabilities, with the abilities being referred to as second capabilities. It should be understood that these alternative designations would be equivalent.

The combination of the requirement, capability and ability indicators provides a very flexible structure for indicating and testing requirements, capabilities and abilities in that it permits the designation of requirements, capabilities and the ability to accept inverted capabilities. This effectively permits logical relationships between individual requirements and capabilities to be expressed and examined.

In a modular system the interconnecting modules each comprises an appropriate set of indicators and compatibility verification logic is provided for evaluating relationships between the requirement, capability and ability indicators.

Preferably, the number of number of the requirement, capability and ability indicators can be varied from module to module. This is of value where a new requirement is developed after a first version of a module is shipped. In later modules, therefore, another set of requirement, capability and ability indicators may be provided without impacting the operation of the computability keying system.

A length indicator may be provided which is representative of the number of at least one of the requirement indicators, capability indicators and ability indicators.

In one embodiment, the module may include a requirement specification comprising a requirement specification length indicator and a number of requirement indicators, the requirement specification length indicator being representative of the number of requirement indicators. Similarly, a capability specification may be provided comprising a capability specification length indicator and a number of capability indicators, the capability specification length indicator being representative of the number of capability indicators. Also, an ability specification may be provided comprising an ability specification length indicator and a number of ability indicators, the ability specification length indicator being representative of the number of ability indicators.

Storage may be provided in the module for each of the requirement structure, the capability structure and the ability structure. Each of the requirement, capability and ability indicators may be formed by a bit in order to minimize the storage needed.

A module type indicator may also be provided, whereby the meaning of respective indicators may vary from module type to module type as indicated by the module type indicator.

The module may be component module connectable to a component of a system, for example a module pluggable into the component. The component may be a system component module. Alternatively, the module could be a system component such as a motherboard for receiving pluggable modules. Further the module could be interfaced with a component which is not itself modular, that is a component which could not be removed from a system and replaced, perhaps because it forms a fundamental system framework.

The module may comprise compatibility verification logic for verifying compatibility between itself and a system component. In this case, the module can be operable to evaluate the following relationships and to determine compatibility where all of the following relationships are satisfied:

MR AND SC=MR;

MA AND SC=SC;

SR AND MC=SR; and

SA AND MC=MC, where AND is a logical AND operator, MR and SR form the requirement indicators for the module and system component, respectively, MC and SC form the capability indicators for the module and for the system component, respectively, and MA and SA form the ability indicators for the module and the system component, respectively.

However, the verification logic may be provided in the component into which the module is plugged, or indeed in a separate agent, for example a processor which does not form part of the module or the component.

Where a variable number of requirement indicators are provided, any unspecified requirements are assumed absent. Similarly, where a variable number of capability indicators are provided, any unspecified capabilities are taken to be absent. Where a variable number of ability indicators are provided, any unspecified abilities are normally taken to be present. However, any unspecified abilities could selectively be assumed present or absent depending on application requirements.

In accordance with another aspect of the invention, there is provided a computer system including:

a system component comprising system requirement indicators defining features of a module required by the system component, system capability indicators defining features provided by the system component and system ability indicators defining features of the module acceptable to the system component;

a module comprising module requirement indicators defining features of a system component required by the module, module capability indicators defining features provided by the module and module ability indicators defining features of the system component acceptable to the module; and compatibility evaluation logic for evaluating the following relationships and for determining compatibility where all of the following relationships are satisfied:
MR AND SC=MR;
MA AND SC=SC;
SR AND MC=SR; and
SA AND MC=MC.

In accordance with a further aspect of the invention, there is provided a method of testing compatibility between a module and a component, wherein each module comprises requirement indicators defining features of a component required for the module to operate, capability indicators defining features provided by the module and ability indicators defining features of the component acceptable to the module, wherein the method comprises:

evaluating the following relationships:
MR AND SC=MR;
MA AND SC=SC;
SR AND MC=SR; and
SA AND MC=MC; and determining compatibility where the relationships are satisfied.

BRIEF DESCRIPTION OF THE DRAWINGS

Exemplary embodiments of the present invention will be described hereinafter, by way of example only, with reference to the accompanying drawings in which like reference signs relate to like elements and in which.

DESCRIPTION OF THE PREFERRED EMBODIMENTS

Figure 1:
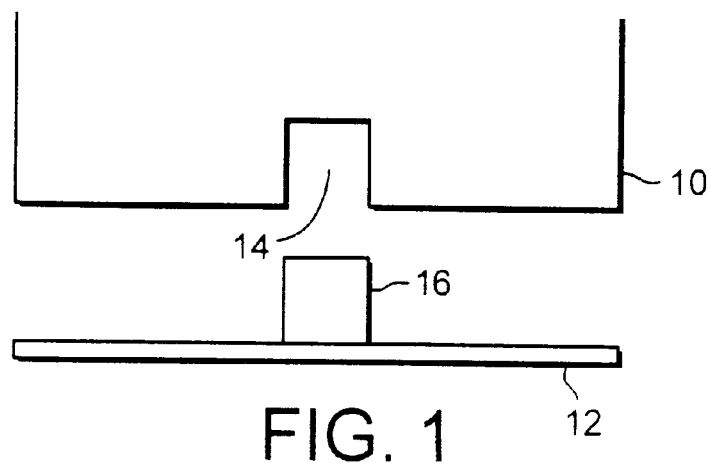
FIG. 1 is a diagram of a prior art mechanical keying arrangement.

FIG. 1 is a schematic representation of a mechanical keying arrangement which could demonstrate compatibility between a card 10 and a motherboard 12. The card 10 is provided with a notch 14 at a predetermined position which is intended to indicate that it requires a 5V supply. The motherboard 12 can be provided with a prong 16 at an equivalent position indicating that it supplies a 5V supply. The matching of the prong and the notch when the card is inserted ensures compatibility between the card and the motherboard. If the prong were at a different place on the motherboard (e.g., indicating that the motherboard provides a 10V supply, then the prong would not find an equivalent notch and therefore the card could not be inserted. However, if no prong were provided on the motherboard, the card could be inserted, but it may or may not receive the supply it needs. It will be appreciated that although the physical arrangement shown in FIG. 1 does provide some information on compatibility, it is very limited in the amount of information it can supply, and does not provide provision for future requirements which may arise after manufacture of the card and/or motherboard.

An embodiment of the present invention seeks to provide a more flexible approach to the determination of compatibility requirements.

Before describing an embodiment of the invention in detail, there follows a description of problems which embodiments of the invention seek to address and a general description of the manner in which various embodiments of the invention solve these problems. It should be understood that an embodiment of the invention need not solve all of the problems discussed. Embodiments with varying optional features can solve different combinations of the problems discussed.

At a general level, consider the situation where a plugged module has a given set of requirements and capabilities. For example, "I need a −12V power supply" is a requirement, and "I can work with a 32-bit bus" is a capability. The system into which it is plugged has a similar list, like "I provide a −12V power supply" and "I need a module that can work with a 32-bit bus".

It must be determined, at the time when a module is plugged in, that the requirements of each mating part are supported by the capabilities of the other mated part.

It may happen that a plugged module supports many capabilities that are not required by the system. A module could have the capability, "I can work with a 64-bit bus". If the system doesn't have the requirement, "I need a module that can work with a 64-bit bus," it doesn't matter. If however there is a choice such as "I can work with a 64-bit bus" and "I can work with a 32-bit bus" then it may be desirable to make a decision as to some optimal use of the jointly supported features.

An embodiment of the present invention addresses this matter. A module providing a set of data associated with a plugged module specifies both the module's requirements and its capabilities. A system into which the module is plugged also provides a set of data which specifies its own capabilities and requirements. A mechanism is provided to ensure compatibility by checking that each requirement of each part is supported by the equivalent capability of the other part.

In one embodiment, two lists are associated with each module, one a list of capabilities and one a list of requirements. A software mechanism can look in turn at each requirement of a module, traversing its requirement list, and confirm that the equivalent capability is present somewhere in the capability list of the other module. This provides a versatile approach which can, however, make significant storage demands on the module and the system.

In another embodiment, compatibility checking is achieved using predefined bit positions in a data structure. Each module has a capability data structure and a requirement data structure. Each bit in the requirement data structure is assigned a meaning, like "I require a 5V supply". To specify that a particular requirement is true, set that bit in the requirements data structure for that module. The same bit in the capability structure has the equivalent meaning, like "I can accept a 5V supply". A mechanism can be provided to check for compatibility by performing the logical AND between the requirements of a module and the capabilities of the mated part, and they must equal the requirements.

This arrangement has its limits. Consider capability fields regarding different versions of a feature A: "I have feature A1[1]", "I have feature A2" and "I have feature A3". It is assumed that any one module will have at most one of these bits set. Now consider a system which requires feature A1 or feature A2, but not feature A3. The system cannot set both the A1 and A2 requirement bits, as they will never both be satisfied. There is no way of specifying an OR of capabilities.

A further embodiment of the invention overcomes this problem. If the capability "I have feature A3" is transformed into the requirement "I require a system that can accept a module with feature A3". There is an equivalent requirement for every capability, so there is no need to add an extra requirement field. The capability field can be interpreted as this secondary requirement field. However, there is a need to add an extra capability field to the mating part. In this case, this extra capability field would specify "I am able to accept a module with feature A3". Often, this extra "capability to accept inverted capabilities" would be true, so you would expect all the bits in the ability field to be 111". In the case for the A features mentioned above, the "I am able to accept a module with feature A1", "I am able to accept a module with feature A2" bits would be set to "1" and the "I am able to accept a module with feature "A3" would be set to "0".

Consider now that the manufacturer wishes to begin building modules with a feature "A4", a capability not envisaged when the module and the software which checks compatibility was designed. No bit corresponding to feature "A4" exists in the data stored in existing modules or in the requirements or capabilities of existing systems.

To cope with this, the data fields are made extensible, consisting of an initial length datum followed by a bit field specified in the length. New modules with feature "A4" can be made with an extra bit in the data field, with an implied meaning for the capability field, "I have feature A4". This corresponds to the requirements field, "I require a module with feature A4" and the ability field, "I am able to accept a module with a feature A4". This arrangement is provided for by the way that the fields are extended if no data bits are provided, because the field length is less than expected. The capability field of a module is implicitly extended with zeroes, because an old module is not going to have a new capability. The requirements field of the system is implicitly extended with zeroes, because an old system does not care about some new capability. The ability field of a system is implicitly extended with ones, because the old system is capable of accepting new capabilities of new modules.

In this example, an old system which didn't care about "A" features provided would set the old "A" requirement bits to 0, and would implicitly have an A4 requirement bit of 0, so would not have any limit on the requirement. The secondary requirements "A" field of the old system would be 1, and the implicit secondary A4 requirement bit would be 1, so the checks would all pass and a module with the feature A4 could be inserted without change into an old system that didn't care about feature "A".

An old system that specifically required modules with feature A2 would not accept the module with feature A4, because the old system would set the "I require a module with feature A2" bit, and the "I have feature A2" bit would not be set in the module with feature A4.

An old system that was able to accept modules with features A2 or A4 but not with feature A3 would, using this arrangement, automatically accept the A4 module, because of the implicit setting of the new A4 ability bit. This might not be what the customer wants. The data system might imply "I can accept a module with any version of feature A as long as it isn't A3", or it might imply "I can only accept modules with features A1 or A2". It is probably not possible to determine which of these is meant until this has been agreed with a customer. However, note that it is generally desirable to manufacture upward-compatible modules, so it is likely that the designer will choose not to build modules with feature A4 if customers are not going to like them.

Figure 2:
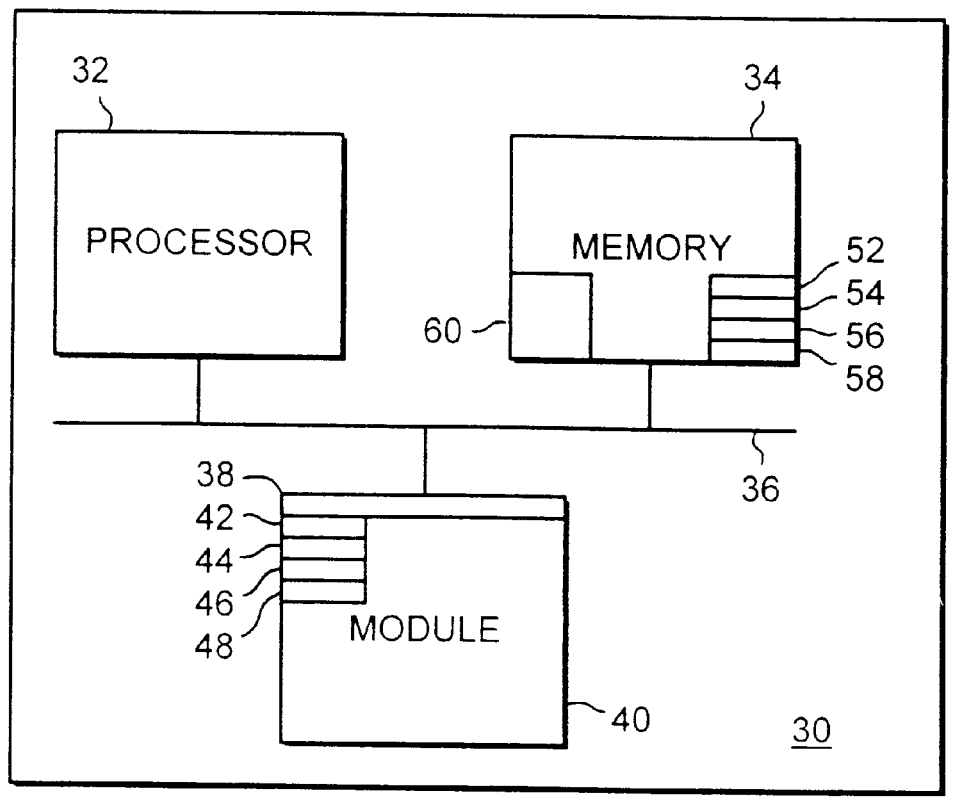
FIG. 2 is a schematic block diagram of various modules interconnected to one another.
Figure 3:
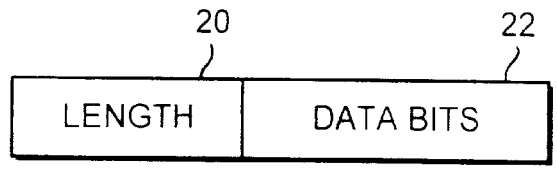
FIG. 3 is a schematic representation of a register of FIG. 2.
Figure 4:
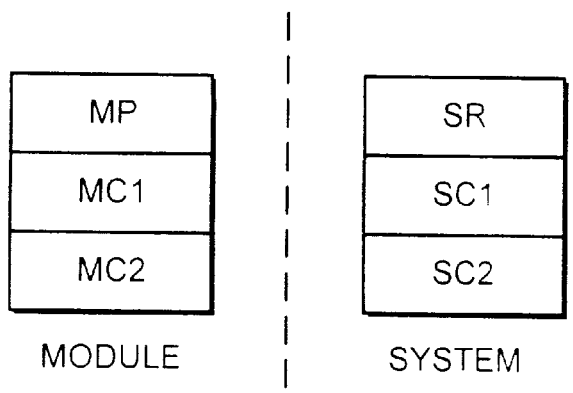
FIG. 4 is a schematic representation of the interaction between control logic and registers for the modules of FIG. 2.

Following this general discussion, there now follows a description of an embodiment of the invention with reference to FIGS. 2–4.

FIG. 2 is a schematic representation of components of a computer system. In particular FIG. 2 schematically illustrates a motherboard 30 supporting a processor 32 and memory 34 connected via a bus 36, as well as other components (not shown) typically provided for such a system. A pluggable module 40 is, however, shown. In the present instance the pluggable module is a card carrying functional circuit elements. However, it could alternatively be any form of pluggable module, such as an I/O card, a random access or any other memory or circuit element, for example a RAM module or a serial number EEPROM, or a processor. Indeed, the module could be a software module for integration with other software modules or with hardware. In each case a module and a cooperating component (which could be hardware or software) will each be provided with a structure defining requirement, capability and ability indicators for the module.

In the presently illustrated example, the pluggable module is pluggable into a socket 38 connected to the bus 36. The pluggable element includes a plurality of registers 42, 44, 46 and 48 for capability type, module requirements, primary module capabilities and secondary module capabilities, respectively (i.e. capabilities and abilities). The processor also maintains in memory registers 52, 54, 56 and 58 for a capability type, system requirements, system capabilities and system abilities, respectively. Each of the registers is used to provide respective data fields comprising a length datum 20 and a number of bits 22 which is specified by the length of datum. An example of such a register is shown in FIG. 3. The purpose of the registers is described in more detail below.

The processor also maintains in memory control code forming compatibility verification logic 60 for establishing compatibility between the system and the module. The compatibility verification logic need not be controlled by the processor, but could be effected by special purpose hardware or by a programmable circuit such as an ASIC. The compatibility verification logic could also be separately supplied on a data carrier such as a disk or tape or could be supplied via a telecommunications medium such a wire or optical cable or by wireless or satellite or indeed any other carrier medium as appropriate. Indeed, the verification logic could be provided by a separate agent as long as that agent is able to detect the requirements, capabilities and abilities and to logically analyze the interrelationships between them.

FIG. 4 is a schematic representation of the interaction between the verification control logic and the various registers. Although reference is made to "registers", they need not be separate registers, but could be defined in random access memory.

As shown in FIG. 4, modules (and the components into which they are to be plugged) each provide three data fields. Each of these fields is implemented as a length datum followed by the specified number of bits.

For a module:
MP is a field defining features of a system component required for the module to operate;
MC is a field defining features provided by the module; and
MA is a field defining features of the system component acceptable to the module.

For a system:
SR is a field defining features of the module required for the system component to accept it;
SC is a field defining features provided by the system component; and
SA is a field defining features of the module acceptable to the system component.

All fields in any computation are extended before use to match the longest field available as between the module and the system. R and C fields are extended with zeroes. A fields are extend with ones. A bit in any field is set if the associated statement about the feature is true.

A module is defined as being compatible if (using the syntax of the programming language "C"):
((MR & SC)==MR) /*System provides all requirements of module*/
&& ((MA & SC) SC) /*No capability of system incompatible with module*/
&& ((SR & MCI)=SR) /*Module provides all requirements of system*/
&& ((SA & MCI)==MCI) /*No capability of module incompatible with system*/

The statement associated with a given bit in a field need not be the same for every product. For example, bit 0 of the SR and SA and MC fields for a power supply could relate to input voltage compatibility.
SR[0] 1 means "The system requires a PSU capable of accepting 240V input"
MC[0] 1 means "This PSU can accept 240V input"
SA[0] 1 means "The system can work with PSUs capable of accepting 240V input"

Clearly, this feature is useless for say, a disk module, where we might be more interested in storage capacity and where an AC voltage is irrelevant.

To implement this variability in meaning, a "feature type" code can optionally be provided as part of the compatibility data. The feature type is a number which describes how the capability and requirement data is interpreted. Feature types must match precisely for the product to be compatible. There is no point in plugging a disk module into a power supply slot. So, in addition to the MR, MC and MA fields, in accordance with one embodiment of the invention, a module also supplies an MT datum, the capability type, which must match the ST type datum for the system. It should be noted that this type code is not necessarily related to the function of the module, just the way the capability and requirement data is interpreted.

For modules of radically different function which can plug into a single slot one approach is to refer, say, to a disk interface or a communications interface, either of which could plug into a PCI slot. Either they could share a common type, which would specify the way the capability bits are interpreted, and numerous capability bits would go unused. In this case the disk interface could set to 0 the capability "I have 4 comms lines".

Alternatively, they could have different types and the system would understand how to compute the compatibility of either type, using different SR, SC and SA fields for each type.

As an example of the versatility and extensibility of this scheme, consider a power supply which has:
MT 14—this has capabilities interpreted for a PSU;
MC[0] 1—I can supply 400 W The system could set for this same interface:
ST 14—This requires capabilities interpreted for a PSU
SR[0] 1—The system requires a supply of 400 W
SA[0] 1—The system can accept supplies capable of 400 W Then, at a later date, higher output supplies are shipped, which have:
MT 14—This has capabilities interpreted for a PSU
MC[0] 1—I can supply 400 W
and also the new capability
MC[23] 1—I can supply 600 W This supply would be correctly seen to be compatible with the old system.

Figure 5:
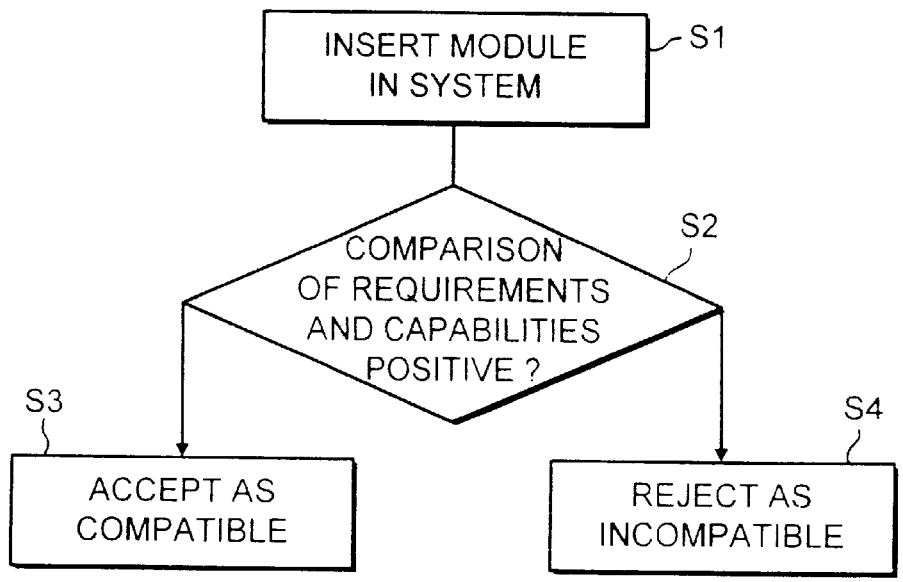
FIG. 5 is a flow diagram illustrating the operation of the control logic of FIG. 3.

FIG. 5 is a flow diagram illustrating the operation of the verification logic 60 of FIG. 2.

In step S1, the module is inserted in the system.

In step S2, a comparison is made by the system between the system and module requirements and capabilities. Thus, if on a comparison of the registers it is determined that:
  the system provides all the requirements of module; and
  no capability of the system is incompatible with module; and
  the module provides all the requirement of the system; and
  no capability of the module is incompatible with the system, then the module and the system are compatible.

This is achieved by establishing, for each bit position in the respective registers that:
MR AND SC equals MR; and
MA AND SC equals SC; and
SR AND MC equals SR; and
SA AND MC equals MC,
where "AND" is a logical "AND" operation.

If the logical comparisons of requirement, capabilities and abilities is true, then the system accepts the module as being compatible in step S3.

If the logical comparison of requirements and capabilities is false, then the module is rejected in step S4. The rejection could take the form of blocking all access to the module concerned, if this is appropriate, or alternative indicating incompatibility, for example by setting an audible or visual warning, or posting a flag in memory to be accessed by a user on or prior to operating the system concerned.

Although in the above description it is assumed that the verification logic is held in the memory 34 of the computing system and is executed by the processor 32, and a module could be provided with suitable logic to perform the necessary verification. As described above, the verification could be performed by a separate, third-party agent, or entity.

There has been described an example of module keying in accordance with an embodiment of the invention. Although this example has been described in the context of pluggable modules for a computer system, the invention finds application to any modular system or apparatus with complex interrelationships between requirements, capabilities and abilities, particularly where those requirements, capabilities and abilities may change with time as new versions of the respective modules may be developed with new requirements, capabilities and/or abilities.

The invention finds particular application to fault tolerant computer systems where it is highly desirable to ensure high availability of the system. In such a case it is particularly important to ensure that any insertable, or pluggable devices in that system can be verified as being fully compatible with the system before they are fully integrated into the system.

Figure 6:
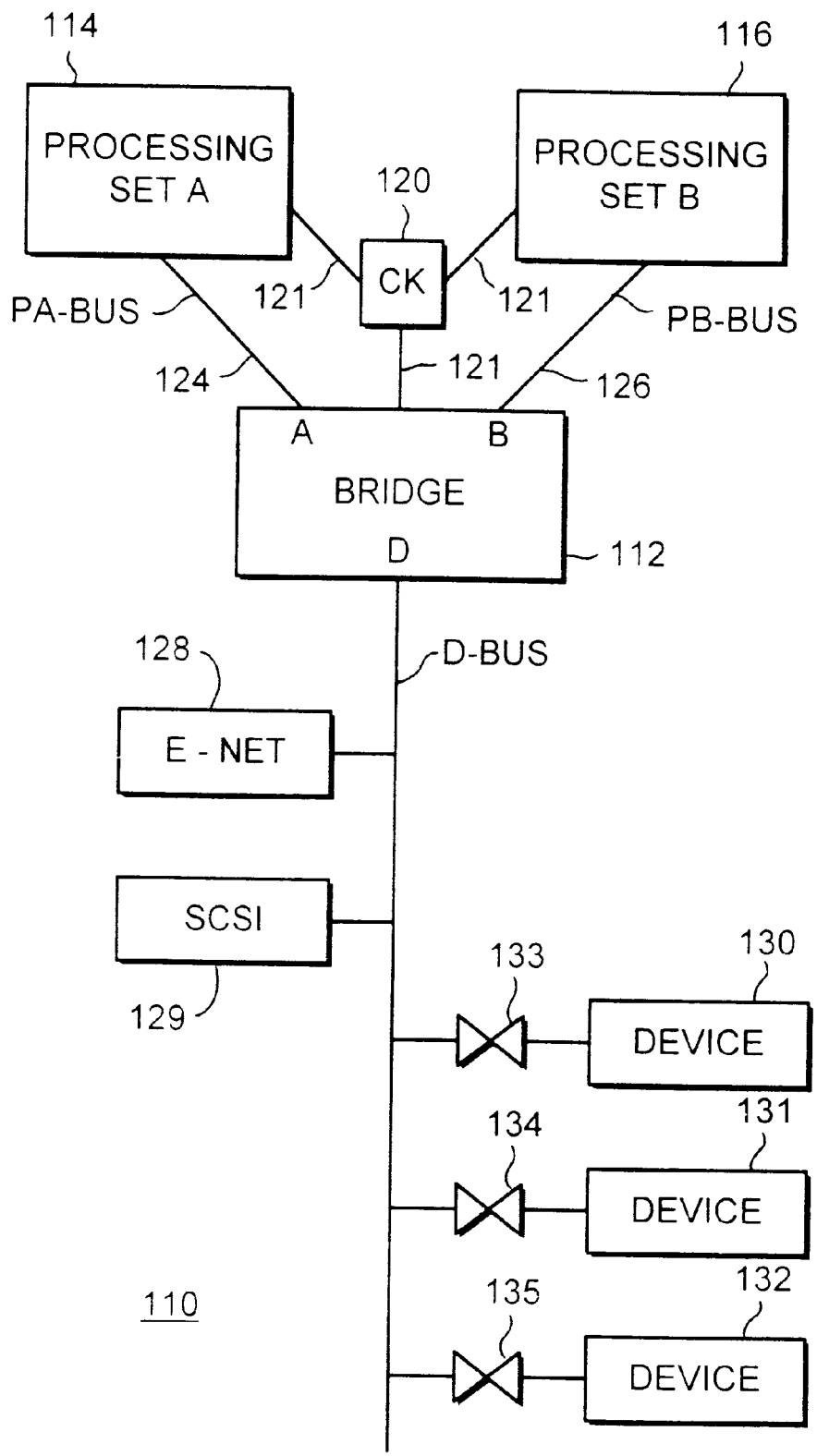
FIG. 6 is a schematic overview of a fault tolerant computer system.

FIG. 6 is a schematic overview of a fault tolerant computer system in which an embodiment of the invention may be implemented.

FIG. 6 is a schematic overview of a fault tolerant computing system 110 comprising a plurality of CPUsets (processing sets) 114 and 116 and a bridge 112. As shown in FIG. 6, there are two processing sets 114 and 116, although in other embodiments there may be three or more processing sets. The bridge 112 forms an interface between the processing sets and I/O devices such as devices 127, 128, 129, 130, 131 and 132. In this document, the term processing set is used to denote a group of one or more processors, possibly including memory, which output and receive common outputs and inputs. It should be noted that the alternative term mentioned above, ° CPUset", could be used instead.

The first processing set 114 is connected to the bridge 112 via a first processing set I/O bus (PA bus) 124, in the present instance a PCI bus. The second processing set 116 is connected to the bridge 112 via a second processing set I/O bus (PB bus) 126 of the same type as the PA bus 124 (i.e. here a PCI bus). The I/O devices are connected to the bridge 112 via a device I/O bus (D bus) 122, in the present instance also a PCI bus.

Although, in the particular example described, the buses 122, 124 and 126 are all PCI buses, this is merely by way of example, and in other embodiments other bus protocols may be used and the D-bus 122 may have a different protocol from that of the PA bus and the and PB bus (P buses) 124 and 126.

The processing sets 114 and 116 and the bridge 112 are operable in synchronism under the control of a common clock 120, which is connected thereto by clock signal lines 21.

Some of the devices 128, 129, including an Ethernet (E-NET) interface 128 and a small computer systems interconnect (SCSI) interface 129 are permanently connected to the device bus 122, but other I/O devices such as I/O devices 130, 131 and 132 can be hot insertable into individual switched slots 133, 134 and 135. Dynamic field effect transistor (FET) switching can be provided for the slots 133, 134 and 135 to enable hot insertability and geographic addressing of the devices such as devices 130, 131 and 132. It will be appreciated that the number of I/O devices which may be connected to the D bus 122, and the number of slots provided for them, can be adjusted according to a particular implementation in accordance with specific design requirements.

The compatibility keying of the present invention could be used for establishing compatibility between the various modular components shown in FIG. 6, or indeed between individual modules which together from the components shown in FIG. 6.

The modules and components to which the compatibility keying is applied can be hardware or software modules and components. A software module could be for integration with other software modules or with hardware. In each case a module and a cooperating component (which could be hardware or software) will each be provided with a structure defining requirement, capability and ability indicators for the module and component. In the case of a software module, this could be provided on a data carrier such as a disk or tape or could be supplied via a telecommunications medium such a wire or optical cable or by wireless or satellite or indeed any other carrier medium as appropriate. The carrier medium could also be a semiconductor or other memory device.

It will be appreciated that although particular embodiments of the invention have been described, many modifications/additions and/or substitutions may be made within the spirit and scope of the present invention as defined in the appended claims.

What is claimed is:

1. A method of testing compatibility between at least two system components, wherein each component includes requirement indicators defining features required by the component, capability indicators defining features provided by the component and ability indicators defining features acceptable to the component, the method comprising:

logically evaluating relationships between the requirement indicators, the capability indicators and the ability indicators of the components to test for compatibility between the components;

and determining compatibility when a predetermined logical relationship is established.

2. The method of claim 1, wherein the following relationships are evaluated:

MR AND SC=MR;

MA AND SC=SC;

SR AND MC=SR; and

SA AND MCI=MC, where AND is a logical AND operator, SR and MR are the requirement indicators for first and second components, respectively, SC and MC are the capability indicators for the first and second components, respectively, and SA and MA are the ability indicators for the first and second components respectively.

3. The method of claim 2, wherein compatibility is determined where the relationships are satisfied.

4. A method of testing compatibility between a system component and a module of a modular system, wherein each module comprises requirement indicators defining features of a component required for the module to operate, capability indicators defining features provided by the module and ability indicators defining features of the component acceptable to the module, wherein the method comprises:

evaluating the following relationships:

MR AND SC=MR;

MA AND SC=SC;

SR AND MC=SR; and

SA AND MCI=MC, where AND is a logical AND operator, MR and SR form the requirement indicators for the module and the component, respectively, MC and SC form the capability indicators for the module and component, respectively, and MA and SA form the ability indicators for the module and component, respectively, and determining compatibility where the relationships are satisfied.

5. The method of claim 4, wherein:

MR and SR each comprise a requirement structure for the module and component, respectively, each requirement structure comprising a variable length requirement indicator field and a requirement length field for indicating a number of requirement indicators in the requirement indicator field;

MC and SC each comprise a capability structure for the module and component, respectively, each capability structure comprising a variable length capability field and a capability length field for indicating a number of capability indicators in the capability indicator field;

MS and SA each comprise an ability structure for the module and component, respectively, each ability structure comprising a variable length ability field and an ability length field for indicating a number of ability indicators in the ability indicator field; and all equivalent requirement, capability and ability indicators in the variable length fields are compared according to the following relationships:
MR AND SC=MR;
MA AND SC=SC;
SR AND MC=SR; and
SA AND MC=MC.

6. The method of claim 5, wherein any unspecified requirements are taken as absent.

7. The method of claim 5, wherein any unspecified capabilities are taken as absent.

8. The method of claim 5, wherein any unspecified abilities are taken as present.

9. The method of claim 5, wherein any unspecified abilities are selectively taken as present or absent.

10. A computer system comprising:
a system component;
a module coupled to the system component;
wherein the system component comprises a set of system component indicators including a system requirement indicator defining features of the module required by the system component, a system capability indicator defining features provided by the system component, and a system ability indicator defining features of the module that are acceptable to the system component;
wherein the module comprises a set of module indicators including a module requirement indicator defining features of the system component required by said module, a module capability indicator defining features provided by the module, and a module ability indicator defining features of the system component that are acceptable to the module; and
compatibility evaluation logic, wherein the compatibility evaluation logic is configured to evaluate a relationship between the set of system component indicators and the set of module indicators to determine compatibility between the system component and the module.

11. The computer system as recited in claim 10, wherein said compatibility logic is configured to evaluate compatibility between said system component and said module based on the following relationships:
MR AND SC=MR
MA AND SC=SC;
SR AND MC=SR; and
SA AND MC=MC;
wherein AND is a logical AND operator, and wherein MR, MC, and MA form the module requirement, module capability, and module ability indicators, respectively, and wherein SR, SC, and SA form the system requirement, system compatibility, and system ability indicators, respectively.

12. The computer system as recited in claim 11, wherein said set of system component indicators and set of module indicators each include:

a requirement structure having a variable length requirement indicator field, and a requirement length field for indicating a number of requirement indicators in said requirement indicator field;

a capability structure having a variable length capability field, and a capability length field for indicating a number of capability indicators in the capability indicator field; and an ability structure having a variable length ability field, and an ability length field for indicating a number of ability indicators in the ability indicator field.

13. The computer system as recited in claim 11, wherein any unspecified capabilities are taken as absent.

14. The computer system as recited in claim 11, wherein any unspecified abilities are taken as present.

15. The computer system as recited in claim 11, wherein any unspecified abilities are selectively taken as present or absent.

16. The computer system as recited in claim 11 wherein any unspecified requirements are taken as absent.

17. The computer system as recited in claim 10, wherein said set of system component indicators and said set of module indicators are readable by said compatibility evaluation logic.

18. A module for a modular system, wherein the modular system includes compatibility evaluation logic for determining compatibility between the module and the modular system, the module comprising:

a requirement indicator defining features required of a component for said module to operate;

a capability indicator defining features provided by said module; and an ability indicator defining features of the component that are acceptable to said module;

and wherein said requirement indicator, capability indicator, and said ability indicator are detectable by said compatibility evaluation logic to determine compatibility between the module and the modular system.

19. The module as recited in claim 18, said module having a first number of requirement indicators, capability indicators, and ability indicators, said module being connectable to a system having a different number of requirement indicators, capability indicators, and ability indicators.

20. The module as recited in claim 18, said module having a length indicator representative of the number of at least one of the requirement indicators, capability indicators, and ability indicators.

21. The module as recited in claim 18 further comprising:

a requirement structure having a variable length requirement indicator field, and a requirement length field for indicating a number of requirement indicators in said requirement indicator field;

a capability structure having a variable length capability field, and a capability length field for indicating a number of capability indicators in the capability indicator field; and an ability structure having a variable length ability field, and an ability length field for indicating a number of ability indicators in the ability indicator field.

22. The module as recited in claim 21 wherein:
said requirement structure includes requirement storage;
said capability structure includes capability storage; and
said ability structure includes ability storage.

23. The module as recited in claim 18, wherein:
each of said requirement indicators includes a requirement bit;

each of said capability indicators includes a capability bit; and each of said ability indicators includes an ability bit.

24. The module as recited in claim 18, wherein said module includes a module feature code.

25. The module as recited in claim 18, wherein said modular system includes a system component, said system component having a system requirement indicator, a system capability indicator, and a system ability indicator.

26. The module as recited in claim 25, wherein said module is pluggable into said system component.

27. The module as recited in claim 26, wherein said system component is a motherboard, said motherboard configured for receiving pluggable modular components.

28. The module as recited in claim 25, wherein said compatibility evaluation logic is configured to evaluate the following relationships to determine compatibility between said module and said modular system when all of the following relationships are satisfied:

MR AND SC=MR

MA AND SC=SC;

SR AND MC=SR; and

SA AND MC=MC;

wherein AND is a logical AND operator, and wherein MR, MC, and MA form said requirement indicator, capability indicator, and ability indicator, respectively, for the module, and wherein SR, SC, and SA form the system requirement indicator, system compatibility indicator, and system ability indicator, respectively.

29. The module as recited in claim 28, wherein any unspecified requirements are taken as absent.

30. The module as recited in claim 28, wherein any unspecified capabilities are taken as absent.

31. The module as recited in claim 28, wherein any unspecified abilities are taken as absent.

32. The module as recited in claim 28, wherein any unspecified abilities are selectively taken a present or absent.

33. A system comprising:

at least two system components, wherein each component includes a requirement indicator defining features required by the component, a capability indicator defining features provided by the component, and an ability indicator defining features of another component that are acceptable to the component; and compatibility evaluation logic coupled to the at least two system components, wherein the compatibility evaluation logic is configured to evaluate a relationship between the requirement indicators, the capability indicators, and the ability indicators of the at least two system components to determine the compatibility between the at least two system components.

34. The system as recited in claim 33, wherein said compatibility logic is configured to evaluate compatibility between the at least two system components based on the following relationships:

MR AND SC=MR

MA AND SC=SC;

SR AND MC=SR; and

SA AND MC=MC;

wherein AND is a logical AND operator, and wherein MR, MC, and MA form the requirement indicators, capability indicators, and ability indicators, respectively, for a first component of the at least two system components, and wherein SR, SC, and SA form the system requirement indicators, system compatibility indicators, and system ability indicators, respectively, for a second component of said at least two system components.

35. The system as recited in claim 34, wherein any unspecified requirements are taken as absent.

36. The system as recited in claim 34, wherein any unspecified capabilities are taken as absent.

37. The system as recited in claim 34, wherein any unspecified capabilities are taken as absent.

38. The system as recited in claim 34, wherein any unspecified abilities are selectively taken as present or absent.

39. The system as recited in claim 33, wherein compatibility is determined where the relationships are satisfied.

* * * * *